United States Patent [19]
Wei et al.

[11] Patent Number: 5,859,404
[45] Date of Patent: Jan. 12, 1999

[54] METHOD AND APPARATUS FOR PLASMA PROCESSING A WORKPIECE IN AN ENVELOPING PLASMA

[75] Inventors: Ronghua R. Wei, Calabasas; Jesse N. Matossian, Canoga Park, both of Calif.; Peter Mikula, Sterling Heights; Deborah Clark, Saline, both of Mich.

[73] Assignees: Hughes Electronics Corporation, El Segundo, Calif.; General Motors Corporation, Detroit, Mich.

[21] Appl. No.: 543,860

[22] Filed: Oct. 12, 1995

[51] Int. Cl.[6] ............................. B23K 10/00; C23C 15/00
[52] U.S. Cl. ............................. 219/121.43; 219/121.57; 219/121.34; 219/121.19; 204/288.08; 204/192.11; 148/239; 148/566
[58] Field of Search ................... 219/121.43, 121.44, 219/121.57, 121.2, 121.34, 121.16, 121.19; 204/298.04, 298.05, 192.1, 192.11, 298.08; 118/723 HC, 724, 725; 148/224, 239, 566

[56] References Cited

U.S. PATENT DOCUMENTS

| | | | |
|---|---|---|---|
| 4,116,791 | 9/1978 | Zega | 204/192 N |
| 4,213,844 | 7/1980 | Morimoto et al. | 204/298.05 |
| 4,342,631 | 8/1982 | White et al. | 204/192 N |
| 5,008,002 | 4/1991 | Uno et al. | 204/192.31 |
| 5,078,847 | 1/1992 | Grosman et al. | 204/192.31 |
| 5,354,445 | 10/1994 | Ito et al. | 204/298.05 |
| 5,571,332 | 11/1996 | Halpern | 118/723 HC |

OTHER PUBLICATIONS

Stickels, C.A., "Gas Carburizing" Ford Motor Company, Manufacturing Development Cener, pp. 312–324.

Muraleedharan, T. M. and Meletis, E. I. "Surface modification of pure titanium and Ti–6A1–4V by intensified plasma ion nitriding" Thin Solid Films, 221 (1992) pp. 104–113.

Meletis, E. I. and Yan, S. "Low–pressure ion nitriding of AISI 304 austenitic stainless steel with an intensified glow discharge" J. Vac Sci. Technol. A. vol. 11, No. 1, (Jan./Feb. 1993) pp. 25–33.

Yan, S. "Ion Nitriding With Intensified Glow Discharge" Thesis, Louisiana State University, (May, 1991) 6 pages.

Nunogaki, M., Suezawa, H., Hayasi, K., Miyazaki, K. "Plasma Source Nitriding" Applied Surface Science, (1988) vol. 33–34 Elsevier Science Publishers, B.V., pp. 1135–1141.

Nunogaki, M., Suezawa, H., Kuratomi Y., and Miyazaki, K. "Effects of ion implantation on nitriding metal by the plasma source nitirding" (1989) Vacuum, vol. 39, No. 2–4, pp. 281–284.

Primary Examiner—Mark H. Paschall
Attorney, Agent, or Firm—V. D. Duraiswamy; W. K. Denson-Low

[57] ABSTRACT

A plasma heating apparatus for heating a workpiece includes a chamber of sufficient size to receive a workpiece therein and a source of a reduced gas pressure within the chamber of from about 0.01 to about 100 millitorr. The plasma heating apparatus further includes a plasma source of an enveloping plasma. Optionally, a workpiece voltage may be applied between the workpiece and the wall of the chamber, and a source of a reactive gas can be provided to backfill the chamber, and radiant heaters can be provided to independently heat portions of the workpiece. In operation, the plasma source produces a plasma that surrounds and heats the workpiece. The plasma and the heating of the workpiece are tailored to achieve controllably uniform or nonuniform heat treatment and/or surface treatment of the workpiece. The apparatus can be used to heat treat the workpiece in vacuum, or a reactive gas such as a gaseous source of nitrogen, carbon, or boron can be backfilled into the chamber to alter the surface chemistry of the workpiece.

17 Claims, 8 Drawing Sheets

METHOD AND APPARATUS FOR PLASMA PROCESSING A WORKPIECE IN AN ENVELOPING PLASMA

BACKGROUND OF THE INVENTION

This invention relates to the heat treatment of workpieces, and, more particularly, to plasma processing of workpieces for reactive or nonreactive heat treatment.

Many materials such as metals and ceramics are heat treated during manufacturing operations. The heat treatment is typically accomplished by heating a workpiece to elevated temperature and holding the workpiece at that temperature for a period of time. The heat treatment may involve heating to a single temperature, or more complex processing such as a series of heating and cooling steps. The heat treatment may also involve one large workpiece, or many smaller workpieces.

The heat treatment of the workpiece(s) is accomplished for any of a variety of reasons. The microstructure and thence properties of many metallic alloys can be varied by heat treatment. Ceramic pieces processed from powders can be sintered to increase their densities and thence improve their strength properties. These types of processing can be accomplished in vacuum or an inert atmosphere. The heat treatment can also involve processing in a reactive gas such as a source of nitrogen or carbon. Such processing introduces an element from the reactive gas into the surface of the workpiece(s) so as to modify its surface properties but not its interior properties. Many combinations of these treatments, and many other treatments, are possible.

The apparatus used to perform a heat treatment must heat the workpiece(s) and, in the situations of interest here, also must control the atmosphere surrounding the workpiece(s) as the heat treating is performed. One well-established approach involves placing the workpiece(s) into a chamber in which the atmosphere can be controlled, and surrounding the chamber with a heater such as a resistance or inductive heater. Such processing apparatus has been available for many years.

More recently, plasma processing of workpiece(s) has been developed to accomplish heat treating more quickly and efficiently than alternative approaches. A plasma composed of equal numbers of electrons and ions is produced and contacted to the workpiece(s). Each workpiece is heated by the energy transferred to it from the electrons, the ions, or the electrons and ions together that are in the plasma. The heat treatment can be conducted in an inert-gas plasma or in a reactive-gas plasma, resulting in the deposition of an ionic species at the surface of each workpiece that alters its surface properties. Cooling may be accomplished by forced or non-forced quenching.

The various methods available for plasma processing are operable, but have drawbacks or disadvantages. Some lack precise controllability or are relatively inefficient. Others produce a plasma that cannot be tailored to uniformly or controllably non-uniformly, as desired, envelop the workpiece(s), resulting in uneven processing of the workpiece(s). Still others do not allow for independent control of plasma production and heat treatment, or produce a high density plasma. Others operate at too high a gas pressure to allow for rapid heat treatment.

There is a need for a plasma processing method and apparatus that can be used to nonreactively or reactively heat treat workpiece(s) and overcomes these disadvantages or limitations. The present invention fulfills these needs, and further provides related advantages.

SUMMARY OF THE INVENTION

The present invention provides a method and apparatus for plasma processing one or more workpieces. The approach may be used in conjunction with, for example, a single, large-scale part such as an automobile forming die, or with larger numbers of small-scale parts such as automotive gears. There is a controlled, variable-density plasma containing equal numbers of ions and electrons that surround the workpiece(s), leading to rapid and efficient heat treatment. The heat treatment can be performed in a partial pressure of a non-reactive gas or a reactive gas to produce surface treatment of the workpiece(s). The apparatus may use conventional quenching techniques or use no quenching at all. The apparatus of the invention can be used by itself, or it can be retrofitted or built into conventional heat treatment furnaces to enhance their capabilities.

In accordance with the invention, a plasma heat treating apparatus for heat treating a workpiece comprises a chamber of sufficient size to receive a workpiece therein and having a chamber wall. Optionally, the chamber may be provided with heater panels, heat shields, heating rods, or the like for assisting in heating the workpiece. The apparatus further includes means for producing and controlling a reduced gas pressure within the chamber of from about 0.01 to about 100 millitorr, and means for selectively producing a variable-density plasma which fills the chamber. The potential of the plasma is near that of the chamber walls. The plasma ion fraction (ratio of ions to neutral density atoms) varies from about 0.1 in the pressure range of 0.01–10 millitorr, to 0.01 or less for pressures from 10–100 millitorr. The means for producing the plasma includes a plasma source that is located either inside the chamber or remotely from the chamber but in gaseous communication with the chamber. The means for producing and controlling a reduced gas pressure desirably includes a vacuum pump or the combination of a vacuum pump, and a controlled gas backfill to introduce a reactive gas such as a source of nitrogen or carbon, or a non-reactive gas such as argon or neon.

More specifically, a preferred plasma heating apparatus includes a chamber of sufficient size to receive a workpiece therein and having a chamber wall, and means for producing a reduced gas pressure within the chamber of from about 0.01 to about 100 millitorr. The means for producing has a vacuum pump communicating with the interior of the vacuum chamber, and a source of a reactive or a non-reactive gas communicating with the interior of the chamber. The source of a reactive gas, when used, includes a source of nitrogen or carbon. The source of a non-reactive gas, when used, includes a source of argon or neon. The apparatus further includes a plasma source for selectively producing a variable-density, enveloping plasma. The source may be located locally within the chamber or remotely outside the chamber. The plasma source may consist of one or more thermionic filaments located within the chamber or remotely from, but in communication with, the chamber, a current source for the thermionic filament(s), and a filament bias voltage source connected between the filament(s) and the chamber wall. The chamber wall is preferably made the anode and the filament the cathode for either a remote or local plasma source. The use of a separate anode, different from the chamber wall, is disadvantageous, as it may lead to sputtering of the chamber wall material onto the workpiece. The filament shape and orientation can be selected to control the plasma density surrounding the workpiece. Alternatively, the plasma source may be the same filament (s), but instead of being activated thermionically, it may be activated by radio frequency energy. In the latter case, the filament acts as an antenna for selectively producing plasma.

In its various versions, the apparatus may further include a source of a workpiece bias voltage connected between the chamber wall serving as the plasma source anode and the workpiece directly or a support for the workpiece. The workpiece bias voltage biases the workpiece negatively as a cathode relative to the chamber wall, which acts as an anode. The bias potential serves to control the amount of ion or electron bombardment of the workpiece surface. If sufficiently low, the bias voltage will allow bombardment of both positive ions and electrons. If sufficiently high, the bias voltage will only accelerate positive ions in the plasma to the workpiece. In the case of the use of a reactive gas, the positive ions bombard, heat, and react with the workpiece surface. In the case of the use of a non-reactive gas, the positive ions and/or electrons only bombard and heat the workpiece surface.

The apparatus of the invention includes a source of an enveloping plasma located within the chamber or remotely from it. The term "enveloping plasma" as used herein refers to a plasma that surrounds the workpiece with a tailored-density plasma, except for those areas that are intentionally shielded from the plasma such as masked areas or areas contacting a workpiece support. The enveloping plasma, in which the workpiece is completely immersed, may have a variable density to allow for selective treatment of the workpiece. No such capability exists for conventional plasma heat treatment techniques.

When the plasma is produced, the gas pressure is controlled in order to control the amount of charge exchange between the ions accelerated into the workpiece as well as the cathode filament. This affects the ion-bombardment energy. The use of a filament cathode may introduce sputtered filament material to the workpiece, which is undesirable. Similarly, the use of a hot thermionic filament may introduce evaporated filament material deposited onto the workpiece, which is also undesirable. To minimize evaporated material, the filament temperature is reduced to a point where evaporation is minimal, but electron emission for plasma production can still be optimally achieved. This temperature is about 2000° C. for thoriated tungsten or about 2300° C. for tungsten. To minimize sputtered filament, material, the filament bias voltage is kept to a low value at fixed pressure to reduce the ion energy, or the pressure can be controlled to reduce the ion energy of sputtering at fixed filament bias voltage. In the former case, a filament bias voltage of 40–60 volts at a pressure of less than 10 millitorr will achieve the desired result. In the latter case, a pressure of about 50–100 millitorr at a filament bias voltage of 40–60 volts achieves the desired result.

The plasma density, its uniformity, and the workpiece bias voltage are controlled in order to control the uniformity of the treatment of the workpiece surface. The temperature of the workpiece is controlled independently to allow for additional control of the heat-treatment process. No conventional heat-treatment technique allows for selective control of these parameters.

By contrast, in the glow discharge technique the pressure within the chamber is quite high, on the order of 0.3–10 Torr or higher, resulting in charge exchange that limits heating and deposition efficiency. The ion fraction is typically less than 0.001. The ion bombardment is the sole source of heating of the workpiece, as there is no electron bombardment of the workpiece. There is no independent control of workpiece temperature and the amount of ion bombardment used for surface treatment. Additionally, in the glow discharge process, there is no ability to selectively control the uniformity of the surface treatment. The workpiece is uniformly immersed in the plasma. Because the workpiece is the cathode electron-emitter in the glow discharge, there is no independent control of the bias voltage and the plasma density.

For example, a nonuniform, three-dimensional object such as a turbine wheel may have a 4-inch thick inner radius and a much thinner 1-inch thick outer radius. Because of this non-uniform cross section, a uniform ion bombardment of the part via the glow discharge process will result in a non-uniform temperature profile, and consequently a non-uniform heat treatment and surface treatment when a reactive gas is used. The present approach allows a non-uniform heating to produce a uniform temperature and surface treatment of such a part. In another example, a small-scale workpiece such as an automotive pinion gear has a size on the order of about 2 inches in diameter. When several hundred such gears are carburized at a time in a group within a heat-treatment apparatus, the uniform plasma produced by the glow discharge technique bombards the gears uniformly. Because the gears positioned in the interior of the group are thermally shielded by the outer gears, the gears in the interior are heated to a higher temperature than the outer gears. The result is a non-uniform heat treatment. The present invention permits a uniform simultaneous heat treatment of such a large group of small workpieces.

In the intensified glow discharge technique, a separate filament emitter is provided in addition to the use of the workpiece as the cathode electron emitter. The chamber pressure is typically about 15–350 millitorr, with the result that charge exchange is reduced as compared with the glow discharge process alone. The ion fraction is about 0.01 or less. There is no ability for selective plasma production.

In the plasma source nitriding technique, the use of a remote plasma source eliminates the use of the workpiece as the cathode electron emitter and allows for low pressure operation to reduce or eliminate charge exchange. There is no capability for independent control of workpiece temperature or ion energy, or selective plasma production.

The present approach, termed plasma ion heating (PIH), overcomes the limitations of these conventional heat-treatment techniques. A plasma is independently produced either inside the chamber or remote from the chamber (but in gaseous communication with the chamber) to allow for controlling the plasma density independent of the workpiece bias voltage. Use is made of external wall heaters, or thermionic filaments may be used to assist in selectively heating the workpiece, independent of the bias voltage and the ion-bombardment process. The bias voltage and gas pressure used are selectively controlled independent of one another to control the amount of charge exchange of the ions bombarding the workpiece. The gas pressure also controls the charge exchange of ions bombarding the cathode filament. This pressure control allows for the ion bombardment energy and the ion density (i.e., plasma density) to be independently varied. It can also contribute to reducing the sputtered filament material deposited onto the workpiece. The plasma produced to treat a workpiece can be selectively controlled to be uniform or non-uniform, depending on the type of heat treatment desired.

In plasma ion heating the operating pressure within the chamber is controlled over the range of from about 0.01 to about 100 millitorr. If the pressure is below about 0.01 millitorr, the plasma is not sufficiently dense to accomplish heating and surface treatment. If the pressure is above about 10 millitorr, charge exchange begins to become an important effect, and is excessively large above about 100 millitorr. The pressure is selected in conjunction with the workpiece bias voltage and the filament bias voltage.

The present invention provides an important advance in the art of plasma processing. Workpieces can be selectively heat treated with or without a reactive atmosphere, with a high efficiency and uniformity of treatment. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
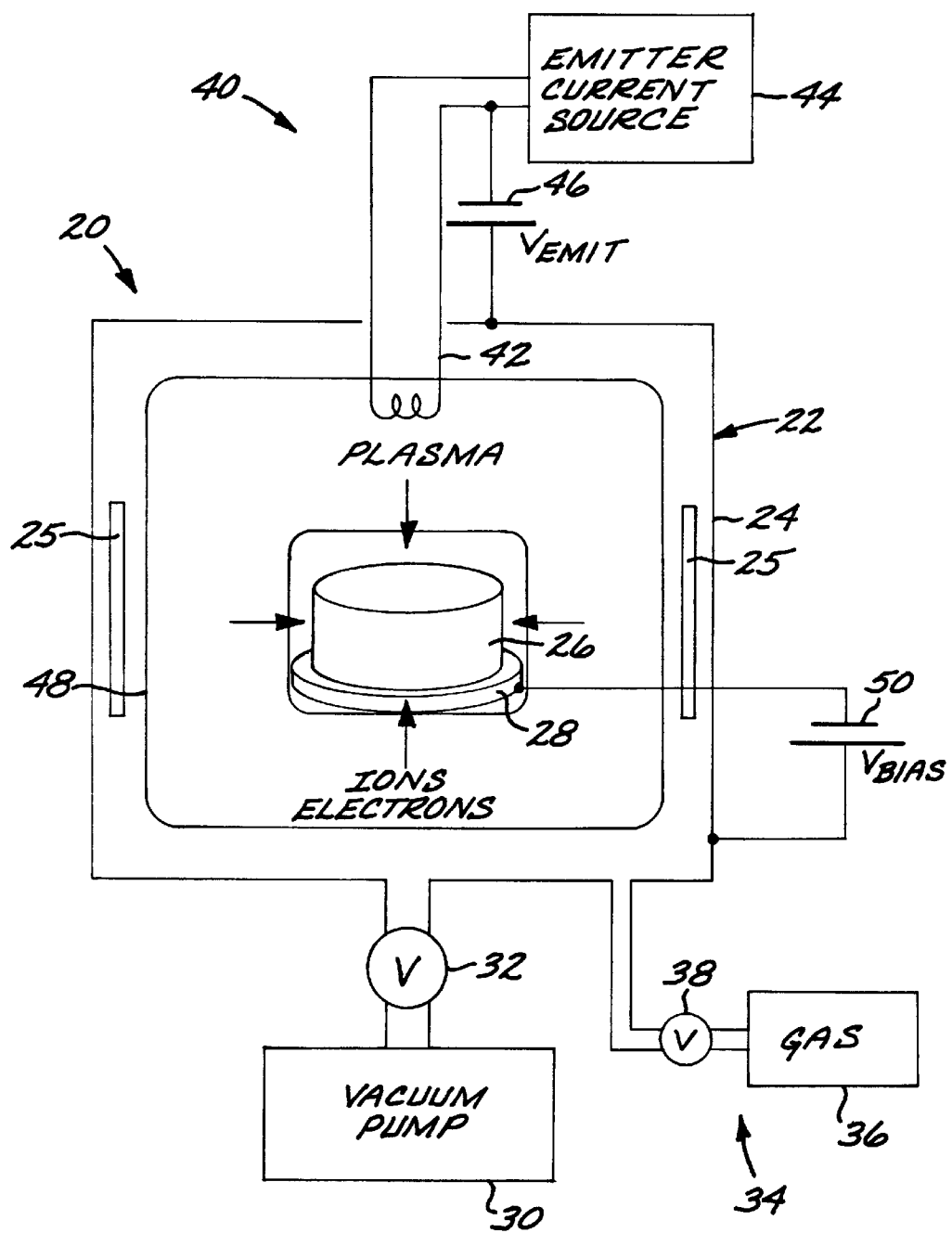
FIG. 1 is a schematic view of a plasma ion heating apparatus.

FIG. 1 schematically depicts an apparatus 20 operable to practice the present approach. The apparatus 20 includes a chamber 22 having a vacuum-tight chamber wall 24 and one or more radiant wall heaters 25. The chamber 22 must be of a sufficiently large size to receive a workpiece 26 therein. The workpiece 26 is desirably supported on a support 28 that is electrically isolated from the chamber wall 24 (except for the optional application of a workpiece bias, to be discussed subsequently).

The atmosphere within the chamber 22 is controlled by a combination of evacuation and backfilling. A vacuum pump 30 communicates with the interior of the chamber 22 through a controllable gate valve 32. The vacuum pump 30 desirably includes a diffusion pump and mechanical pump of sufficient size to achieve reasonably high vacuum, on the order of $10^{-6}$ Torr within the chamber 22, if desired. The vacuum level may, however, be controlled by operation of the gate valve 32, and in particular may be adjusted to a lesser vacuum if desired.

The chamber 22 may be backfilled with a gas from a gas source 34. The gas source includes a gas supply 36 communicating with the interior of the chamber 22 through a backfill valve 38. Where the apparatus 20 is to be used for heat treating only, without chemical processing of the surface of the workpiece, the gas source 34 may not be used at all, or it may be used to supply an inert gas such as argon to the chamber 22. Where the apparatus 20 is to be used for reactive surface processing of the workpiece during the heating, the gas source 34 supplies a reactive gas such as a gaseous source of nitrogen, carbon, or boron from the gas supply 36.

The total gas pressure within the chamber 22 is controlled to be from about 0.01 to about 100 millitorr, to control the ion fraction over the range of about 0.1 to 0.001. A convenient way to accurately control the gas pressure is to open the gate valve 32 to permit the vacuum pump 30 to pump the chamber 22 to a slightly higher vacuum than desired. The backfill valve 38 is cracked open as necessary to permit gas from the supply 36 to flow into the chamber to establish the desired total pressure. The vacuum within the chamber 22 is thus a continuously pumped dynamic vacuum that is effective to maintain the desired atmosphere in a steady state manner and to sweep away impurities such as might be evolved from the workpiece 26 or the chamber wall 24. Alternatively, but also within the scope of the invention, the chamber may be statically pumped by first evacuating the chamber with the vacuum pump 30 and closing the gate valve 32. Gas is backfilled through the valve 38 until the desired pressure is reached, and the valve 38 is closed. The chamber may further include permanent magnets or electromagnets located on its exterior to aid in plasma confinement.

Plasma is produced within the chamber 22 by operating a plasma source 40 within the chamber 22. The plasma source 40 includes an electron emitter, preferably in the form of one or more filaments 42 located within the chamber 22. The filaments may be made of tungsten or thoriated tungsten, or the filaments may be replaced by hollow cathodes. The filament shape and geometry can be adjusted to follow the contour or shape of the workpiece surface in order to tailor the plasma density, and thereby the heat treatment distribution of the workpiece surface. More than one filament with varying shapes can be placed at various locations in the chamber 22 in order to adjust the shape and density of the resulting plasma to fully and uniformly, or non-fully and non-uniformly, envelop the workpiece(s) positioned within the chamber.

An emitter current source 44 supplies a current to the filament 42. The current flowing through the filament 42 heats the filament and causes the emission of electrons from the filament into the interior of the chamber 22. A filament bias voltage 46, $V_{EMIT}$, of typically about 50–100 volts is applied between the filament 42 and the chamber wall 24, so that a plasma 48 is formed within the interior of the chamber 22. It is important that the chamber walls serve as the anode to ensure that the potential of the plasma be near to that of the chamber wall.

Electrons and ions from the plasma 48 impinge upon the workpiece 26, causing it to heat. The filament temperature, bias voltage, and pressure are all selected to provide the desired ion fraction. The workpiece 26 may be electrically isolated at a floating potential, and it will still heat in the plasma. This approach is preferably used if the workpiece is made of a nonconducting material such as a ceramic.

Optionally, a workpiece bias voltage 50, $V_{BIAS}$, of up to about 2000 volts, may be applied between the workpiece 26 (or the portion of the support 28 that is in electrical communication with the workpiece 26) and the chamber wall 24. The workpiece 26 is made negative or cathodic with respect to the chamber wall 24 by the bias voltage 50. The cathodic potential of the workpiece 26 serves to accelerate any positive ions in the plasma toward the workpiece 26. This approach is preferably used if the workpiece is made of an electrically conducting material such as a metal or can be made electrically conducting for the purposes of the heat treatment. Depending upon the magnitude of the bias voltage 50, electrons will bombard the workpiece simultaneously with the ions. This capability allows for greater flexibility in the heating of the workpiece surface.

Figure 2:
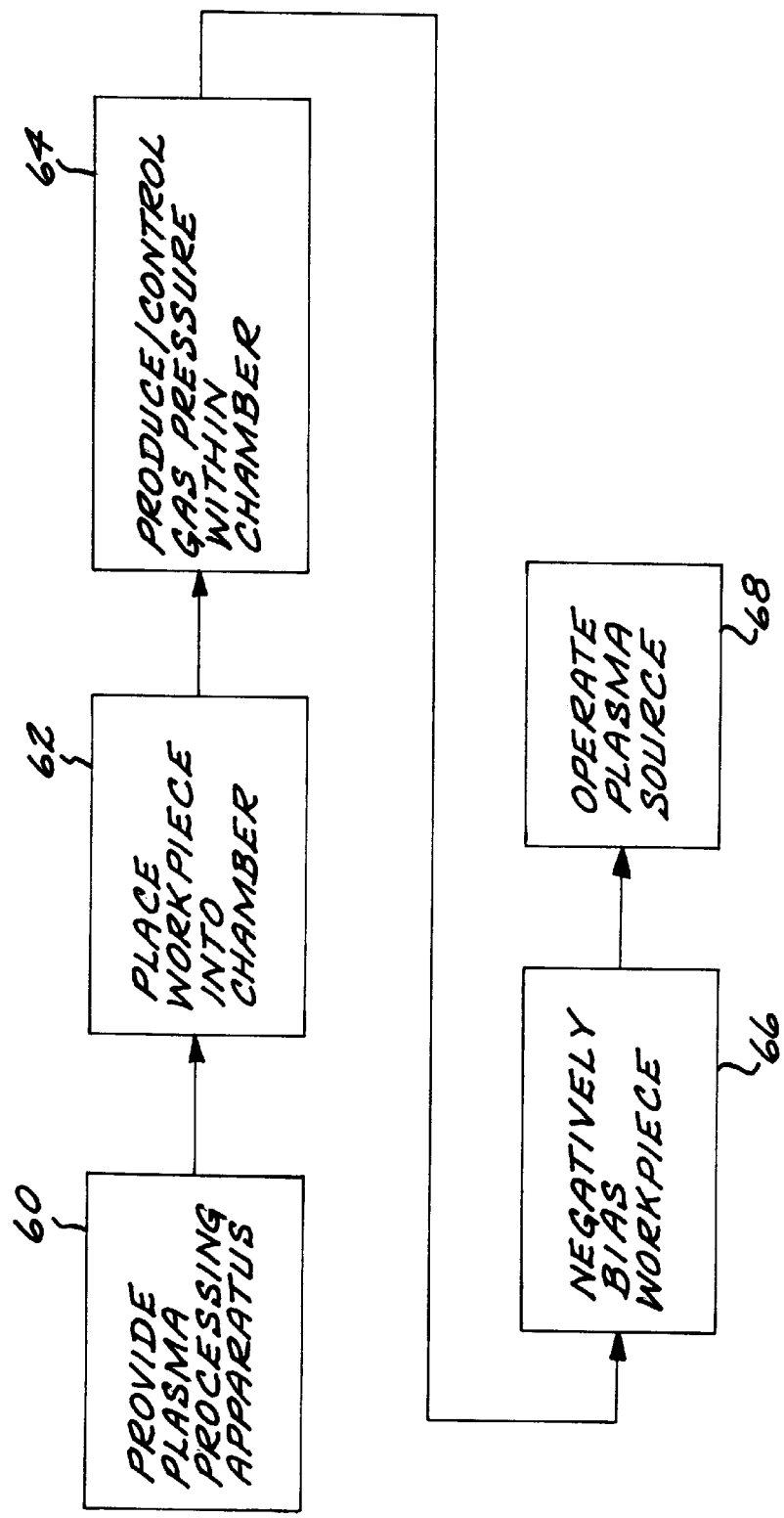
FIG. 2 is a process flow diagram for practicing the approach of the invention.

In operation as depicted in FIG. 2, the plasma processing apparatus 20 of any of the configurations discussed herein is provided, numeral 60. The workpiece 26 is loaded into the chamber 22, numeral 62, and the chamber is sealed. A plurality of workpieces could be loaded. The workpiece(s) placed into the chamber may be electrically conducting or nonconducting, or of complex or simple shape(s). No limitation on the type of workpiece is known, except that it must withstand the plasma processing environment. A relatively large workpiece of interest to the inventors is a die used in forming automotive panels. Such a large workpiece is preferably heat treated by itself, one at a time. A relatively small workpiece of interest to the inventors is a steel automotive pinion gear that is surface hardened using the present approach. Such small workpieces are desirably heat treated in large groups of up to several hundred workpieces at a time. The vacuum chamber wall heaters 25 are adjusted to heat the workpiece to a selected temperature. In addition, radiated power from the filament 42, as well as ion or electron bombardment from the plasma via the bias voltage, can be used in conjunction with, or in place of, the wall heaters to adjust the workpiece temperature.

A gas pressure of about 0.01 to about 100 millitorr is produced within the chamber, numeral 64. If the procedure is used for heat treatment only, the gas pressure is obtained by controlled vacuum pumping only, or a combination of controlled vacuum pumping and a controlled backfilling with an inert gas to reach the desired pressure. If the procedure is used for reactive surface processing, the desired gas pressure is obtained by the combination of controlled vacuum pumping and controlled backfilling with a reactive gas from the gas source 34. By way of example and not limitation, surface nitriding may be accomplished by backfilling with nitrogen gas and surface carburizing may be accomplished by backfilling with methane, butene, toluene, or other carbon-containing gas that decomposes with an associated deposition of carbon into the surface of the workpiece. The gas pressure can be actively controlled during the heat treatment to control the amount of charge exchange, and therefore the amount of surface treatment. This control can be accomplished at a fixed bias voltage, or, alternatively, the gas pressure can be fixed and the bias voltage varied.

As discussed above, the processing may be accomplished with the workpiece at a floating potential, or alternatively with the workpiece biased, numeral 66. Step 66 is therefore optional.

The plasma source 40 is operated to create the tailored plasma 48 within the chamber 22. Energy is transferred from the plasma to the workpiece, heating the workpiece. Biasing step 66, when present, is performed concurrently with the operation of the plasma source, step 68. The biasing may be pulsed or continuous, as desired. Biasing increases the energy of any positive ions accelerated into the surface of the workpiece during reactive processing. It also affects the amount of electron bombardment that impinges onto the workpiece, which also aids in heating the workpiece. The plasma source is operated for as long as is necessary to accomplish the desired heat treatment.

The part is first biased at low voltage, 10–50 volts, to slowly bombard the surface of the part. The ion source can be an inert gas such as argon to initially sputter-clean the surface of the part prior to actual heat treatment. The gas can then be changed to an active source of the desired element to conduct the heat treatment. Alternatively, the same gas can be used for both sputtering and heat treatment.

Figure 3:
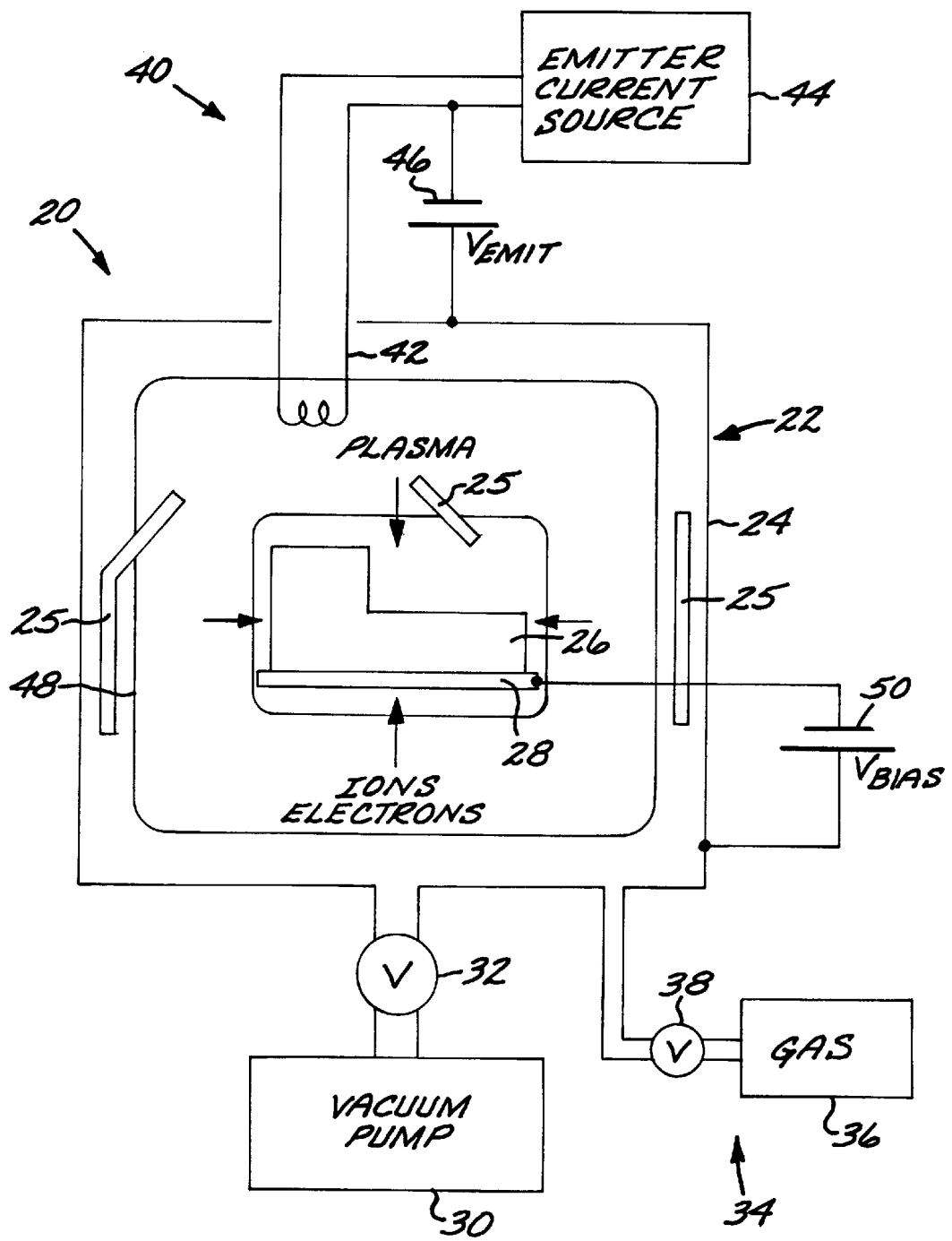
FIG. 3 is a schematic view of a plasma ion heating apparatus with a filament and heaters positioned around an irregularly shaped workpiece.

FIGS. 3–8 illustrate embodiments of the invention consistent with the above description of the apparatus and method, which is incorporated. In FIG. 3, the single workpiece 26 is irregularly shaped. A single filament 42 and several shaped radiant heaters 25 are positioned to be closely adjacent to the heaviest section of the workpiece so as to preferentially heat the heaviest section of the workpiece. The result is a controllably uniform or nonuniform heat treatment. That is, in some cases it may be preferred to equally heat treat (and optionally surface treat) all of the regions of the irregularly shaped workpiece. In other cases, it may be preferred to preferentially heat treat (and optionally surface treat) regions of the workpiece. The judicious positioning of the filament and the heaters, and the processing parameters, allows such selection of the processing.

Figure 4:
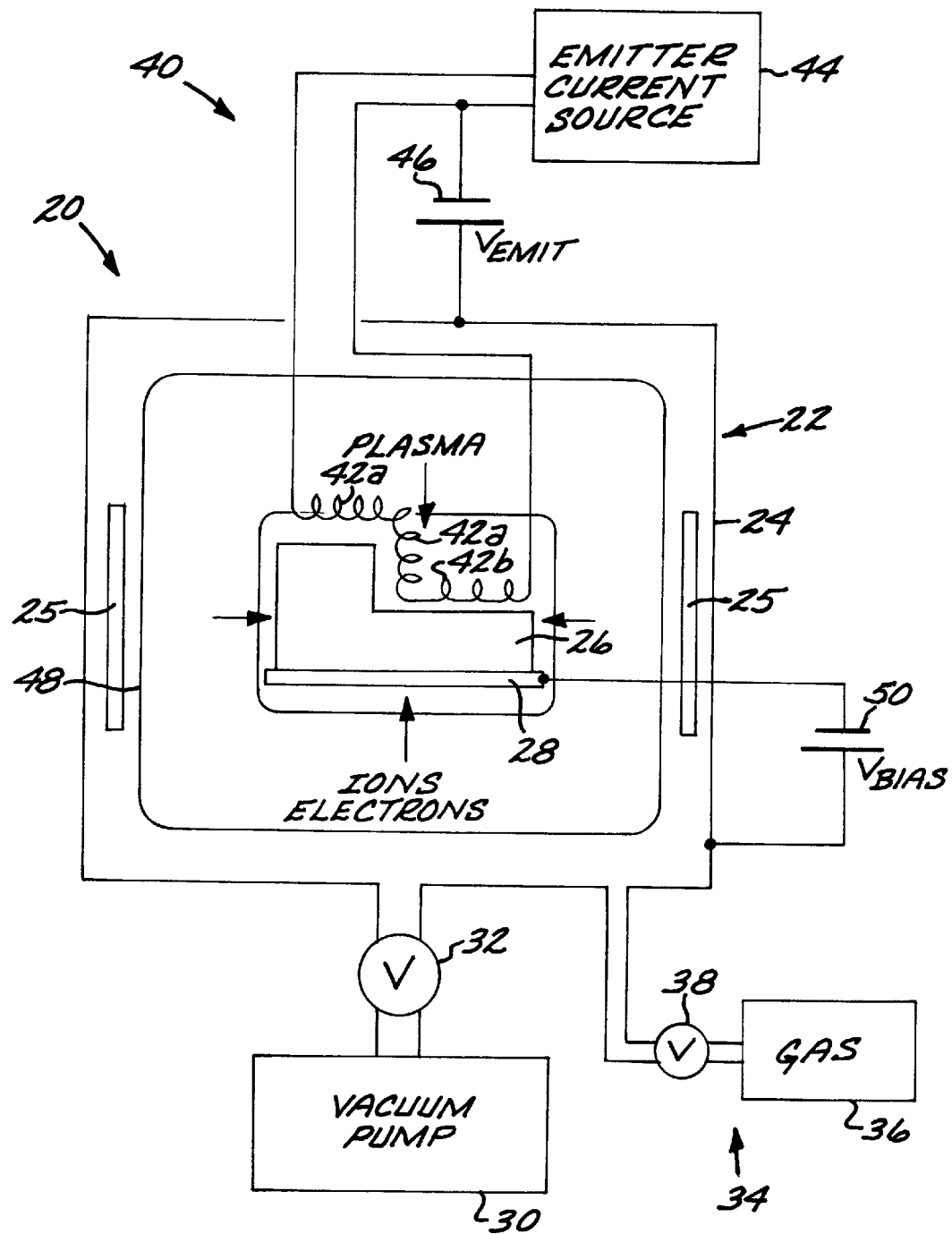
FIG. 4 is a schematic view of a plasma ion heating apparatus with a shaped filament.

In FIG. 4, the single filament 42 is shaped to achieve a desired result. In this case, the filament 42 is shaped to conform to the surface of the workpiece. A first segment 42a of the filament is wound so as to achieve more emission than a second segment 42b.

Figure 5:
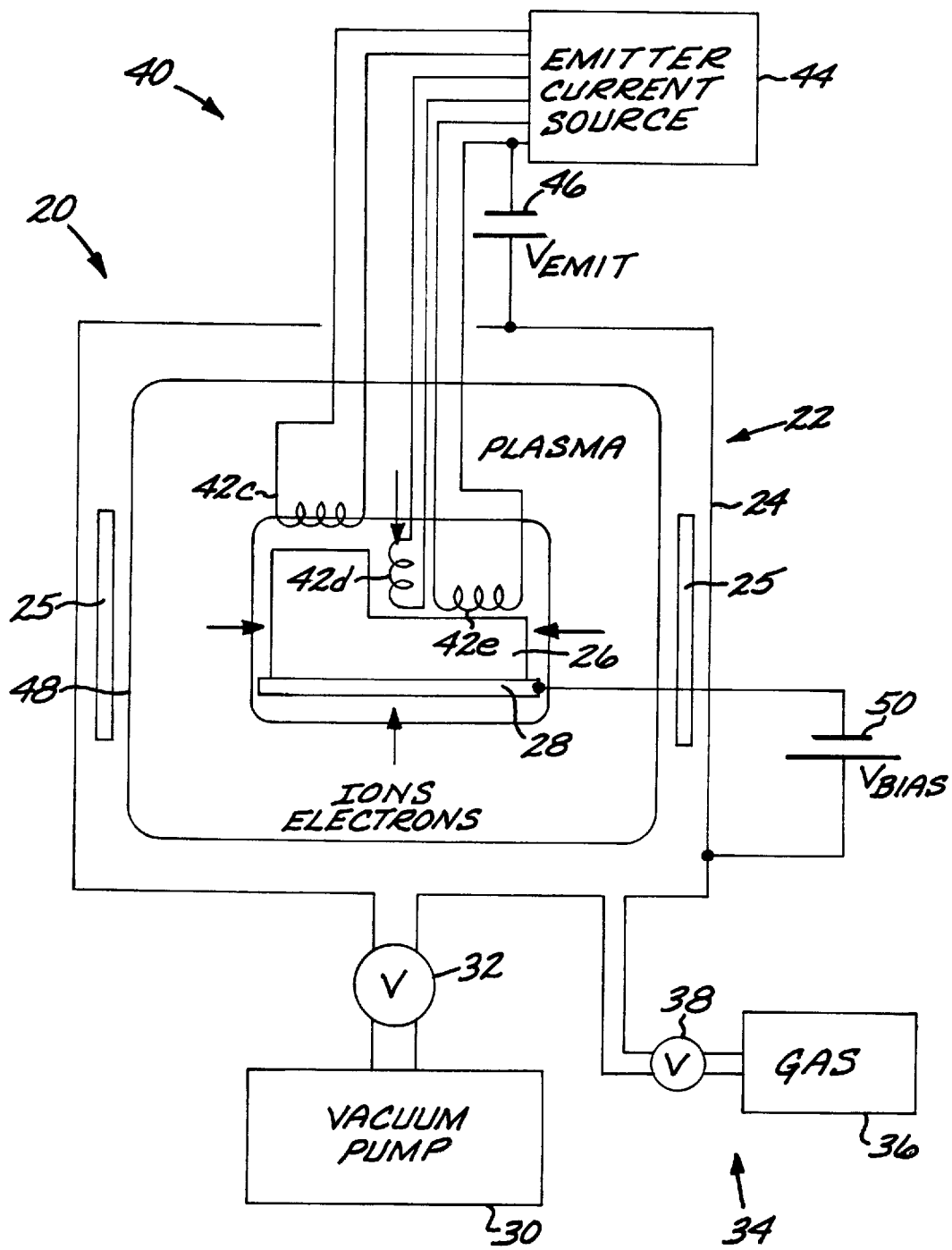
FIG. 5 is a schematic view of a plasma ion heating apparatus with multiple filaments.

In FIG. 5, a similar approach is taken, except that multiple filaments 42c, 42d, and 42e are used. The filaments are positioned to achieve a desired heating of the surface of the workpiece and plasma density in the region of the workpiece. The use of multiple filaments 42 has the advantage that each filament is controllably independently of the others.

Figure 6:
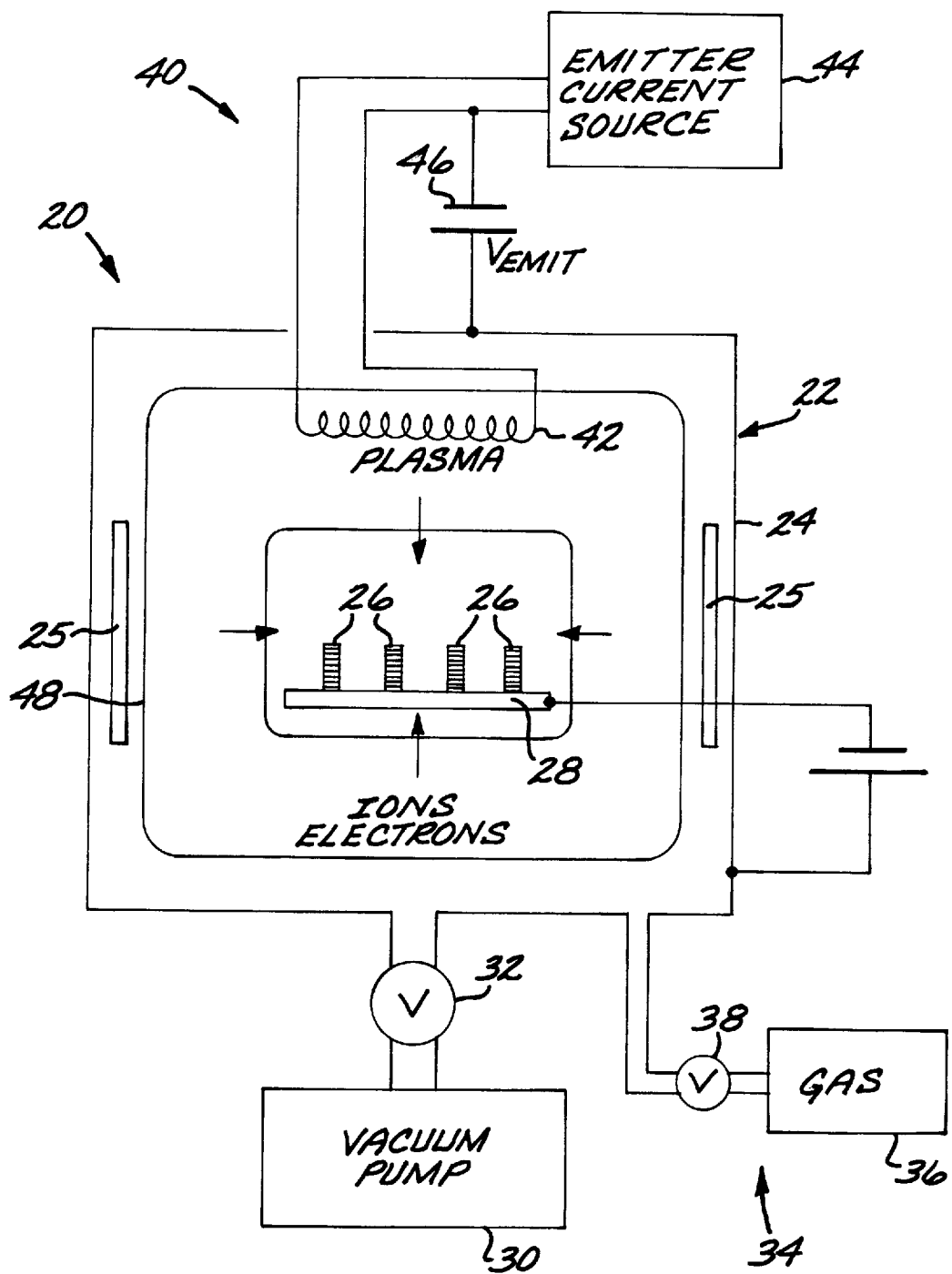
FIG. 6 is a schematic view of a plasma ion heating apparatus with multiple workpieces.

In FIG. 6, multiple workpieces 26 are placed into the chamber 22. The radiant wall heaters 25 are selected and powered such that, in combination with the heat produced by the filament 42, each workpiece 26 is heated uniformly regardless of its position relative to the other workpieces. If non-uniform heat treatment is desired, each workpiece may be individually biased, or the filament configuration can be changed.

Figure 7:
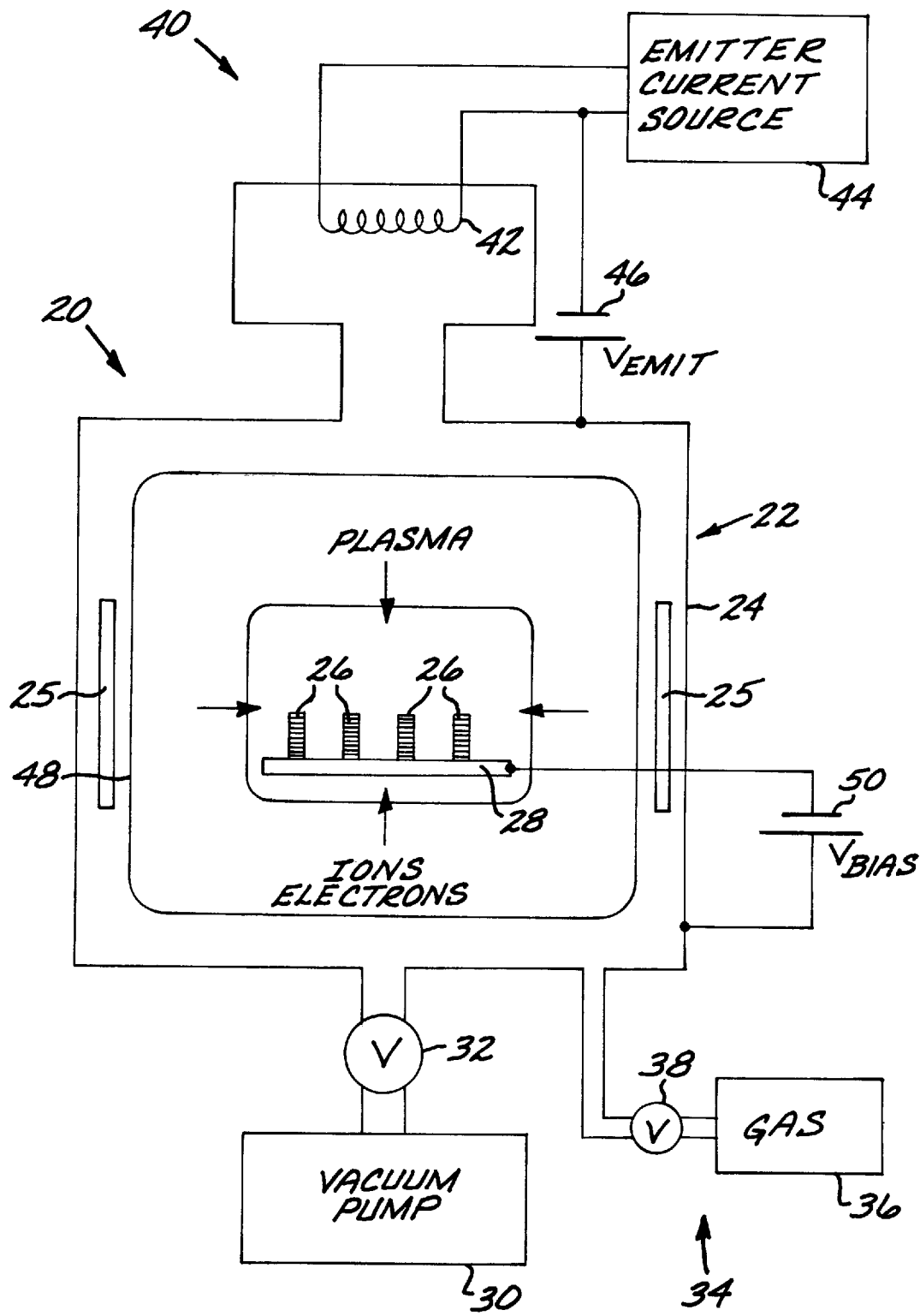
FIG. 7 is a schematic view of a plasma ion heating apparatus with a remote plasma source.

In FIG. 7, the plasma source 40 is positioned remotely from the chamber 22, but such that there is gaseous communication between the plasma source 40 and the interior of the chamber 22. The plasma is produced in the remote plasma source 40 and diffuses into the chamber 22. It is important that the plasma be non-uniform, and that the plasma have a potential near that of the chamber wall.

Figure 8:
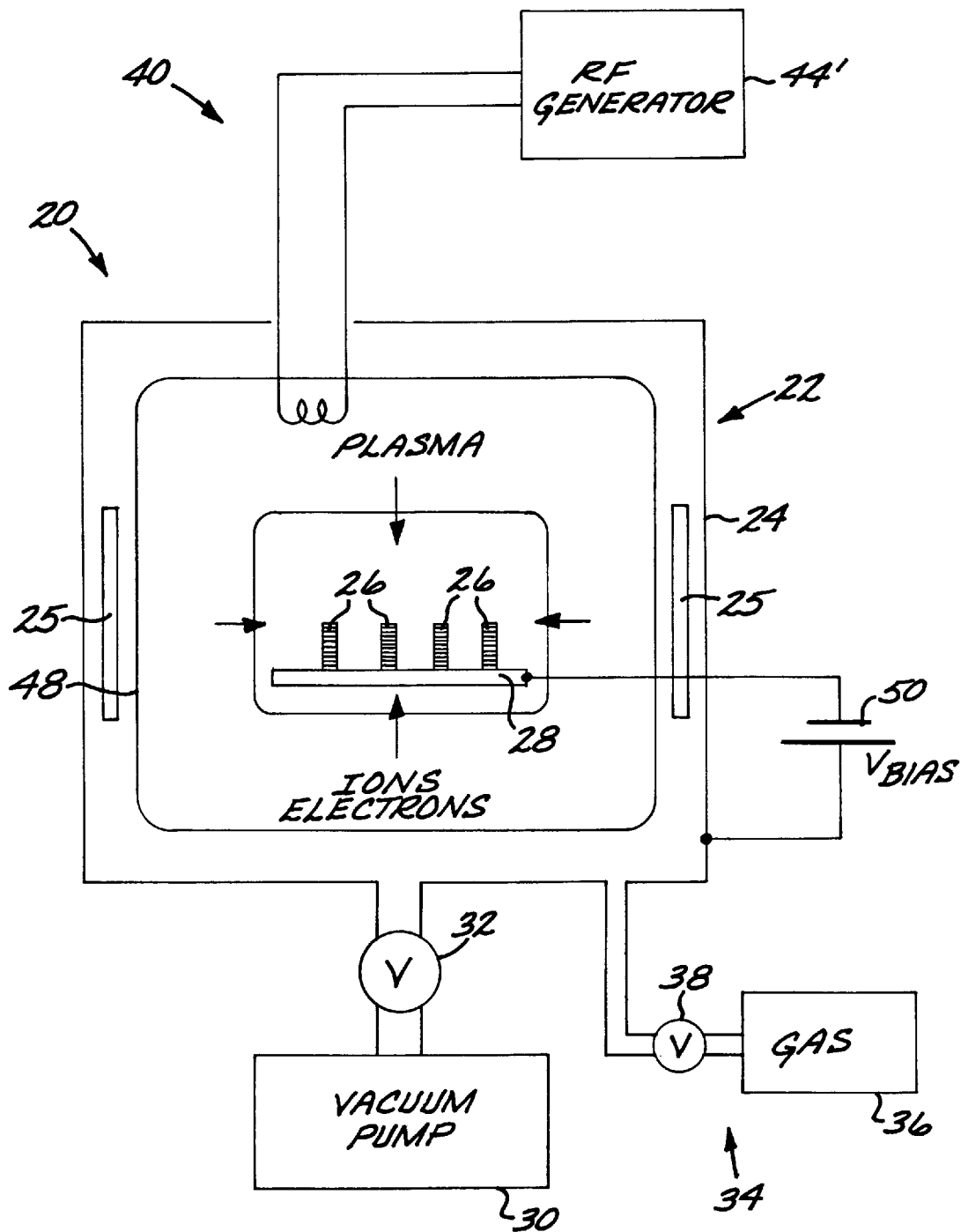
FIG. 8 is a schematic view of a plasma ion heating apparatus with a filament excited by radio frequency energy.

In FIG. 8, the filament 42 is excited by a radio frequency (RF) transmitter 70 driven by a RF generator 72. That is, the thermionic power source is replaced by an RF power source. The filament 42 acts as an antenna.

FIGS. 1 and 3–8 illustrate a number of features by which selectively uniform or nonuniform heat treatment and surface treatment can be accomplished. The various features can be used together in combinations other than those illustrated, and it is not the intent that the operable configurations be limited to those illustrated. For example, multiple filaments could be used with multiple workpieces.

Two types of the apparatus 20 have been constructed and operated consistent with the schematic drawings of FIGS. 1–2 and the prior apparatus description. The first chamber 22 was a cylinder about 2 feet in diameter and 3 feet long. The second chamber was a cylinder about 4 feet in diameter and 8 feet in length. Studies were performed to establish the operability of the present approach. The following examples are intended to illustrate the use of the invention, but should not be interpreted as limiting the scope or application of the invention in any respect.

EXAMPLE 1

Nitriding of Steel

Several 304 stainless steel plate workpieces, each about 2 inches in diameter and ⅛ inch thick, were placed onto a table support in the first apparatus chamber. The chamber was pumped to a background pressure of about $1-3\times10^{-6}$ Torr and thereafter backfilled with nitrogen gas to a pressure of about $5\times10^{-4}$ Torr.

A single emission filament was heated using an AC emitter current source to provide a filament current of 20 amperes and filament voltage of 40 volts. A non-uniform plasma discharge was produced using a single filament that was small enough to produce a localized plasma that then filled the chamber nonuniformly. A DC filament bias voltage of 150 volts and 4 amperes. A DC workpiece bias voltage of about 150 volts and 100 milliamperes was applied for 30 minutes. During this time, the temperature of the part was maintained at about 400° C. No external heating form the chamber walls was used.

The plates were studied microscopically after completion of the nitriding. It was found that nitrogen in solid solution had penetrated into the surfaces of the plates. Wear tests of the treated plates and untreated plates for comparison were conducted using a pin-on-disk wear tester. The wear tests verified a load-bearing capacity of the treated plates of about 1000 times the load-bearing capacity of the untreated plates.

EXAMPLE 2

Carburizing of Steel

Gear blanks about 1½ inches in diameter and 0.7 inches tall and made of 4118H pinion steel were processed in the first chamber. The chamber was evacuated to a background pressure of about $1-3\times10^{-6}$ Torr and backfilled with about 5–10 millitorr of toluene ($C_7H_8$) gas.

The discharge voltage was 150 volts with a current of 10 amperes. A workpiece bias voltage of about 700–1000 volts was applied to the workpiece to heat the gear blanks, without the use of external chamber heaters, to about 900° C. A bias current of 400–550 milliamperes was observed. The gear blanks reached temperature about 5 minutes after the bias voltage was applied. The bias voltage was thereafter reduced to about 400 volts to maintain the 900° C. temperature. After 30 minutes, processing was discontinued. The gear blank cooled to ambient temperature and was removed from the chamber.

Microstructural studies of the gear blanks were performed. The gear blanks were uniformly carburized to a concentration of about 0.8–0.9 percent carbon to a depth of about 0.3–0.4 millimeters. This is the desired carburizing concentration and depth required for a commercial product.

EXAMPLE 3

Heating Without Workpiece Bias Voltage

Gear blanks of the type used in Example 3 were placed into the first chamber onto the insulated support and allowed to electrically float, with no workpiece bias voltage being applied. The approach was otherwise similar to that of Example 2, except that 1-butene gas ($C_4H_8$) was backfilled into the chamber to a pressure of about 10 millitorr.

The filament was heated using an AC current of 60 amperes and a voltage of 160 volts. The discharge voltage was 150 volts, and a current of 40 amperes was obtained. After about 5 minutes of processing, the gear blanks reached an equilibrium temperature of about 730° C. The floating point potential of the gear blanks was 30–40 volts. This resulted in the deposition of a carbon layer at the surface of the gear blank which was used to later carburize the gear.

EXAMPLE 4

Selective Plasma Production

Four filaments were placed inside the second chamber. The filaments had lengths of four feet and were suspended in an equidistant manner across the length of the chamber. A two feet wide by four feet long workpiece support table was used. Several 304 stainless steel places as in Example 1 were placed on the support table. Uniform plasmas were produced by energizing all four filaments equally, resulting in uniform nitriding. Non-uniform plasmas were produced by energizing only a single filament, resulting in non-uniform nitriding.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A plasma heating apparatus for heating a workpiece, comprising:
   a chamber of sufficient size to receive a workpiece therein and having a chamber wall;
   means for producing a reduced gas pressure within the chamber of from about 0.01 to about 100 millitorr; and
   a plasma source of an enveloping plasma, the plasma source being operable in the pressure range of from about 0.01 to about 100 millitorr, including an emitter of electrons other than the workpiece, and having as its anode the chamber wall, wherein the plasma source includes means for generating a plasma which has a controllably variable density at different locations relative to the workpiece.

2. The apparatus of claim 1, wherein the means for producing includes
   a source of a non-reactive gas communicating with the interior of the chamber.

3. The apparatus of claim 1, wherein the means for producing includes
   a source of a reactive gas communicating with the interior of the chamber.

4. The apparatus of claim 3, wherein the source of a reactive gas includes
   a source of a gas that is decomposable to produce an element selected from the group consisting of nitrogen, carbon, and boron.

5. The apparatus of claim 1, further including
   means for independently controlling ion bombardment energy of ions from the plasma source and the plasma density.

6. The apparatus of claim 1, further including
   a radiant heater within the chamber positioned to assist in the heating of the workpiece, the radiant heater being operable independently of the plasma source.

7. The apparatus of claim 1, wherein the workpiece comprises a plurality of workpieces.

8. The apparatus of claim 1, wherein the plasma source is located within the chamber.

9. The apparatus of claim 1, wherein the plasma source is located remotely from the chamber.

10. The apparatus of claim 1, wherein the plasma source includes a source of radio frequency energy.

11. The apparatus of claim 1, further including a workpiece located within the chamber.

12. The apparatus of claim 11, further including a workpiece bias voltage source connected between the workpiece and the chamber wall.

13. The apparatus of claim 1, wherein the plasma source includes a thermionic emitter located within the chamber, a heater for the thermionic emitter, and an emitter bias voltage source connected between the thermionic emitter and the chamber wall.

14. A plasma heating apparatus for heating a workpiece, comprising:

a chamber of sufficient size to receive a workpiece therein and having a chamber wall;

means for producing a reduced gas pressure within the chamber of from about 0.01 to about 100 millitorr, the means for producing including a vacuum pump communicating with the interior of the vacuum chamber, and a source of a gas controllably communicating with the interior of the chamber; and a plasma source of an enveloping plasma, the plasma source including a thermionic filament located within the chamber, a current source for the thermionic filament, and a filament bias voltage source connected between the filament and the chamber wall, the filament bias voltage source biasing the chamber wall anodically relative to the filament.

15. The apparatus of claim 14, further including a workpiece located within the chamber, and a workpiece bias voltage source connected between the workpiece and the chamber wall.

16. The apparatus of claim 14, further including a radiant heater within the chamber positioned to assist in the heating of the workpiece, the radiant heater being operable independently of the plasma source.

17. The apparatus of claim 14, wherein the filament comprises at least two filaments.

* * * * *